US006434679B1

(12) United States Patent
de Bonis-Hamelin et al.

(10) Patent No.: US 6,434,679 B1
(45) Date of Patent: Aug. 13, 2002

(54) ARCHITECTURE FOR VITAL DATA MANAGEMENT IN A MULTI-MODULE MACHINE AND PROCESS FOR IMPLEMENTING AN ARCHITECTURE OF THIS TYPE

(75) Inventors: Marie-Antoinette de Bonis-Hamelin, Saint Egreve; Zoltan Menyhart, Meylan, both of (FR)

(73) Assignee: Bull, S.A., Louveciennes (FR)

( * ) Notice: Subject to any disclaimer, the term of this patent is extended or adjusted under 35 U.S.C. 154(b) by 0 days.

(21) Appl. No.: 09/199,346

(22) Filed: Nov. 25, 1998

(30) Foreign Application Priority Data

Nov. 27, 1997 (FR) .............................. 97 14899

(51) Int. Cl.$^7$ ............................................. G06F 12/00
(52) U.S. Cl. ............................ 711/161; 711/5; 711/101
(58) Field of Search ........................... 711/5, 136, 161, 711/2, 101; 710/126, 130; 709/105; 707/7; 712/27; 713/310; 365/191

(56) References Cited

U.S. PATENT DOCUMENTS

| | | | | |
|---|---|---|---|---|
| 4,570,220 A | * | 2/1986 | Tetrick et al. | 710/126 |
| 4,594,653 A | * | 6/1986 | Iwashita et al. | 712/27 |
| 4,811,216 A | | 3/1989 | Bishop et al. | |
| 5,228,132 A | * | 7/1993 | Neal et al. | 711/5 |
| 5,307,485 A | * | 4/1994 | Bordonaro et al. | 707/7 |
| 5,465,338 A | * | 11/1995 | Clay | 710/130 |
| 5,471,603 A | * | 11/1995 | Yokote et al. | 711/2 |
| 5,590,308 A | * | 12/1996 | Shih | 711/136 |
| 5,652,893 A | * | 7/1997 | Ben-Meir et al. | 713/310 |
| 5,701,482 A | * | 12/1997 | Harrison et al. | 709/105 |
| 5,717,642 A | * | 2/1998 | Pascucci et al. | 365/191 |
| 5,867,430 A | * | 2/1999 | Chen et al. | 365/189.04 |
| 5,867,714 A | * | 2/1999 | Todd et al. | 395/712 |
| 6,215,705 B1 | * | 4/2001 | Al-Shamma | 365/189.04 |

FOREIGN PATENT DOCUMENTS

| | | |
|---|---|---|
| EP | 602 772 | 6/1994 |
| EP | 681 239 | 11/1995 |
| JP | 9-288603 | 11/1997 |

OTHER PUBLICATIONS

Salim Hariri et al., "Architectural Support for Designing Fault–Tolerant Open Distributed Systems", vol. 25, No. 6, Jun. 1, 1992, pp. 50–61, XP000303775.

Baker, W. E. et al, A Flexible Servernet–Based Fault–Tolerant Architecture, 25th International Symposium on Fault Tolerant Computing Digest of Papers, Pasadena, Jun. 27, 1995, No. Symp. 25, Jun. 27, 1995 Institute of Electrical and Electronics Engineers, pp. 2–11, XP000597772.

\* cited by examiner

*Primary Examiner*—David Hudspeth
*Assistant Examiner*—Fred F. Tzeng
(74) *Attorney, Agent, or Firm*—Miles & Stockbridge P.C.; Edward J. Kondracki

(57) ABSTRACT

The invention relates to an architecture for management of vital data in a multi-module digital data processing machine (1) and the process for its implementation. Each module ($M_1$ through $M_n$) comprises a physical nonvolatile memory ($NVM_1$ through $NVM_n$) in which vital data is stored. A first area ($G_1$ through $G_x$) stores global vital data obtained by copying and associated with the operation of the machine (1). A second area ($L_1$ through $L_x$) stores local vital data associated with the operation of the module ($M_1$ through $M_n$). A virtual nonvolatile memory in two parts, global memory and local memory divided into windows, makes it possible, under the control of an extension of the operating system, to address the physical nonvolatile memories ($NVM_1$ through $NVM_n$). The windows of a defective module ($M_1$ through $M_n$) are not visible. At the startup, a specific firmware determines the state of the modules ($M_1$ through $M_n$). After that, the integrity of the vital data is under the control of the extension of the operating system.

20 Claims, 1 Drawing Sheet

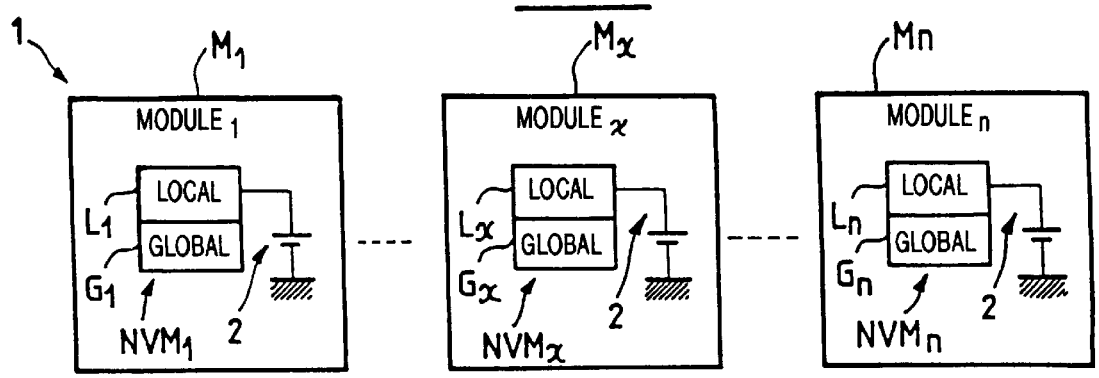
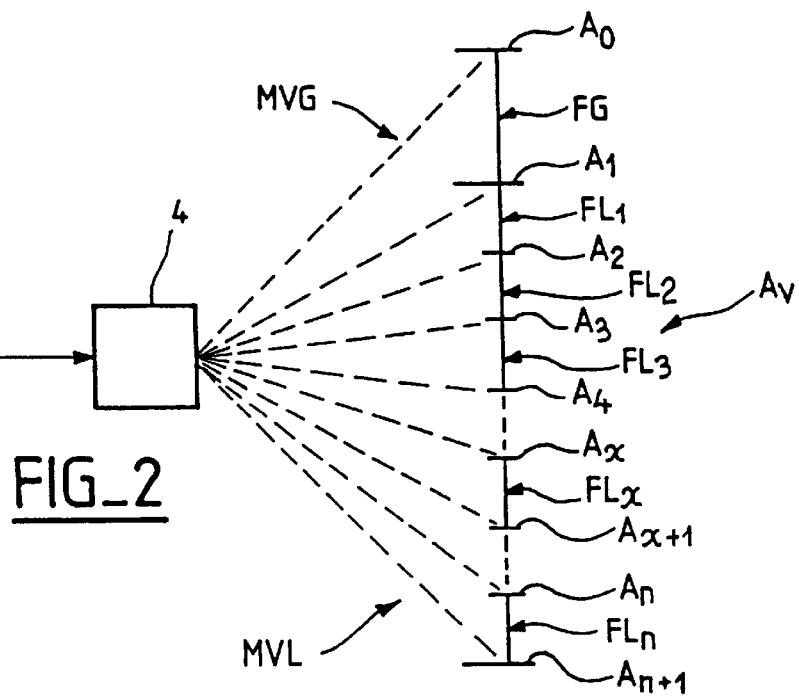
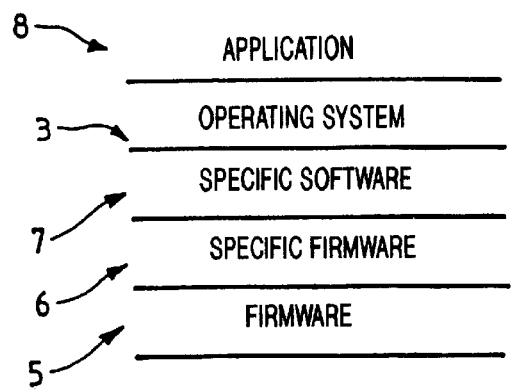

ARCHITECTURE FOR VITAL DATA MANAGEMENT IN A MULTI-MODULE MACHINE AND PROCESS FOR IMPLEMENTING AN ARCHITECTURE OF THIS TYPE

FIELD OF THE INVENTION

The present invention relates to an architecture for vital data management in a multi-module digital data processing machine.

It also relates to a vital data management process for implementing an architecture of this type.

Within the scope of the invention, the term "vital" applies to data essential to the proper functioning of all or part of the machine or of its modules. More generally, it applies to any data that the user of the machine wants to save or protect even in case of a malfunction of a part of this machine.

DESCRIPTION OF RELATED ART

The so called "multi-module" digital data processing machines are composed of "building blocks," or basic modules, which are identical and are suitably interconnected so as to be able to communicate with one another.

For the sake of simplification, "multi-module digital data processing machines" will hereinafter be referred to as "machines."

For the type of machine mentioned above, one of the main requirements to be met is that, even if a module becomes defective, the vital data must be able to be recovered.

In the known art, there are existing so-called "high reliability" machines which allow the protection of data. They have a high degree of hardware redundancy. A plurality of identical devices are linked to one another. In other words, these machines use hardware mechanisms to replicate the data and ensure their consistency.

While the result obtained is entirely in keeping with what one might expect from these arrangements, these machines nevertheless have a major drawback: their cost is high, precisely because of the hardware redundancy, and their hardware architecture is complex.

In most cases, the use of a costly solution is not justified. On the contrary, even though a certain redundancy may still be necessary, it is increasingly apparent that the reduction of the cost (production, materials used, etc.) is a requirement that cannot be overlooked. Moreover, the price of hardware has fallen sharply in recent years, while the performance levels of machines have increased considerably.

SUMMARY OF THE INVENTION

The object of the invention is to mitigate the drawbacks of the devices of the prior art, while more effectively meeting the requirements that have recently come to light.

The process according to the invention makes it possible to ensure the integrity of vital information.

It offers a specific machine architecture for the management of vital data and a process for managing this vital data.

For this purpose, each module is equipped with a nonvolatile memory in which vital data are stored, according to an organization that will be explained below.

The memory is the type known by the English abbreviation "NVRAM" (for "Nonvolatile Random Access Memory"). This type of memory allows reading, but also high-speed writing of data. It is protected by a continuous electric power supply using piles or batteries, so that it continues to function when the machine is turned off or in case of a power failure. It saves the stored data, in this case the above-mentioned vital data. This memory is distinct from the other memories: the read-only memory ("ROM") or the random access memory ("RAM").

These memories constitute a set of local, so-called "physical," nonvolatile memories, and this set is seen by the operating system of the machine, or an extension of the latter, as a single, virtually addressed nonvolatile memory.

This local physical memory comprises two parts: a first part stores a copy of so called "global" vital data, a second part stores local "private" data. This is also true of the virtual address space: a first part is constituted by what will be called a "global virtual nonvolatile memory," the global vital data being "seen" only once; a second part is constituted by what will be called a "local virtual nonvolatile memory."

The management process comprises two main phases: a first phase, at the startup of the machine, during which the state of the modules and their memories is verified, and a second phase, when the operating system is started up, during which access to the virtual address memory is ensured, as is the consistency of the physical nonvolatile memories.

One subject of the invention is an architecture for vital data management in a multi-module digital data processing machine, this machine comprising a predetermined maximum number of modules, characterized in that each of these modules comprises a physical nonvolatile memory in which this vital data is stored.

Another subject of the invention is a vital data management process for implementing this architecture.

The invention has a number of advantages and clearly achieves its stated objects since, while ensuring the integrity of the vital data, it requires only a slight increase in the quantity of hardware used: essentially the presence in each module of a nonvolatile memory of moderate capacity. The redundancy stricto sensu is limited to the replication of the so-called "global" data in each module.

BRIEF DESCRIPTION OF THE DRAWINGS

The invention will be more clearly understood and its other characteristics and advantages will become apparent through the reading of the following description in reference to the appended figures, in which:

FIG. 1 illustrates, in a simplified way, an architecture of a multi-module digital data processing machine according to the invention;

FIG. 2 schematically illustrates a virtually addressed nonvolatile memory which allows access to physical nonvolatile memories comprised in each module of the architecture of FIG. 1;

FIG. 3 schematically illustrates the various software layers with which the multi-module digital data processing machine according to FIG. 1 is equipped.

DESCRIPTION OF THE PREFERRED EMBODIMENTS

FIG. 1 illustrates an architecture of a multi-module machine 1 according to the invention, for vital data management. The machine 1 comprises n modules, referenced $M_1, \ldots M_x, \ldots, M_n$. Each module, in addition to the usual components (not represented) such as a central processor, a random access memory, etc., also comprises, according to an important characteristic of the invention, a specific nonvolatile memory: $NVM_1, \ldots, NVM_x, NVM_n$.

As indicated above, these are advantageously memories of the "NVRAM" type, protected by continuous electric power sources 2, for example piles or rechargeable batteries.

According to another important characteristic of the invention, each nonvolatile memory, which is described as "physical" since it is a hardware unit, is divided into two memory location areas, that is, physical addresses. A first area of each nonvolatile memory is allocated a copy of global vital data. These areas are labelled $G_1, \ldots, G_x, \ldots, G_n$. This global vital data is associated with the operation of the machine considered in its entirety. A second area of each nonvolatile memory is allocated to the storage of private data, local to the module in question. These areas are labelled $L_1, \ldots, L_x, \ldots, L_n$. This data relates to the operation specific to each module.

The contents of the first areas, $G_1$ through $G_n$, must all be identical. There is a copy, or replicated part, in each module $M_1$ through $M_n$, which is loaded during an initial phase.

To give a non-limiting example, the global vital data comprises information such as the network address of the machine, or if there are several possible connections, the main network address, the name of the system, the peripheral from which the machine is initialized ("booted") and the associated options, etc.

Seen from the operating system, or more precisely, as will be shown below, from a specific extension 7 of this operating system, the set of physical nonvolatile memories $NVM_1$ through $NVM_n$ constitutes a single continuous virtual address space Av, as illustrated by FIG. 2. The eight-bit bytes are addressable in a segment that ranges from an address $A_0$ to an address $A_{n+1}$, the address $A_0$ being a priori the address 0. The maximum size of this virtual memory space Av depends on the maximum configuration of the machine 1, particularly the maximum number of modules $M_1$ through $M_n$, and on the quantity of vital data, both local and global.

Like the physical nonvolatile memories $NVM_1$ through $NVM_n$ the virtual memory Av also comprises two parts.

The first part is constituted by a range FG of addresses $A_0$ through $A_1$, which allows access to the global vital data. In effect, the global data are "seen" only once by the operating system, via its extension 7, since only the vital global data are copied (duplicated) in each local physical memory $NVM_1$ through $NVM_n$. This part of the virtual memory Av will be called the "global virtual nonvolatile memory" MVG.

Similarly, the second part of the virtual memory is called "local virtual nonvolatile memory" MVL. The number of "windows" or elemental address segments is equal to the maximum number of modules $M_1$ through $M_n$ that the machine 1 can comprise, for example n if the configuration represented in FIG. 1 is the maximum configuration, or a greater number if that is not the case.

In FIG. 2, the address segments are labelled $A_1$–$A_2$, $A_2$–$A_3$, $A_3$–$A_4$, ..., $A_x$–$A_{x+1}$, ..., $A_n$–$A_{n+1}$ for the windows corresponding to the local vital data $FL_1$, $FL_2$, $FL_3$, ..., $FL_x$, ..., $FL_n$, respectively.

The mechanism 4 for allocating addresses in the virtual address space Av is a standard mechanism, known per se, which there is no need to describe further.

It must also be understood, of course, that while the address configuration illustrated by FIG. 2 is advantageous, it is not the only one possible. By way of example, the virtual memory area MVG corresponding to the global vital data could just as well be located in an area of high addresses.

According to the invention, if any module $M_x$ (or at least the physical nonvolatile memory associated with it, $NVM_x$) is defective, crashes, or does not exist (the actual hardware configuration of the machine is less than the maximum configuration), its address window $FL_x$ remains or becomes inaccessible in the virtual memory space corresponding to the "local virtual nonvolatile memory" MVL. In any case, this means that the module in question is not, or is no longer, accessible.

The actual procedure for ensuring the integrity of the vital data will now be described. According to the process of the invention, this procedure comprises two main phases.

The first phase, or initial phase, relates to the startup or restart period of the machine 1.

FIG. 3 schematically illustrates the software layers associated with the machine 1: two lower layers constituted by a standard "firmware" 5 and a specific firmware 6, i.e., comprised of microinstructions, two intermediate layers constituted by a specific software 7 called an "abstraction layer" (which will be described below) and the operating system 3, and an upper layer constituted by application or user software 8.

The so-called "specific" firmware layer 6 complements the firmware layer 5, which can be called standard, even if the latter is of a so-called "proprietary" type. In fact, whether or not the mechanisms specific to the invention are installed, the only difference at the level of the lower layers is constituted by the presence or absence of this specific firmware layer 6. In other words, it is not necessary to modify the standard layer 5.

The function of the specific firmware layer 6 is to verify, during the startup, i.e., before the operating system 3 is started, the state of the physical nonvolatile memories $NVM_1$ through $NMV_n$, especially whether the checksums of the data blocks are correct.

In a way that is even more specific to the invention, the specific firmware 6 compares the content of the first memory areas $G_1$ through $G_n$ of the physical nonvolatile memories $NMV_1$ through $NMV_n$, that is, the areas related to the global vital data, in order to determine whether their contents are identical.

If the specific firmware 6 finds errors, i.e., inconsistencies, there are two main methods for correcting errors, as indicated below.

For what will be called a "high availability" option, a majority vote mechanism (not represented), which is standard per se, is provided. If there are one or more memories wherein the content of the first area (for example the content of the area $G_x$ for a memory $NVM_x$ having an arbitrary rank x) does not match that obtained by the majority vote, this memory (or these memories) is (or are) declared to be in the "minority." It is (or they are) reinitialized in order to re-write the content of the first area (for example $G_x$ if the only malfunctioning memory is $NMV_x$) so that it matches the one obtained by the majority vote. This operation is carried out under the supervision and control of the specific firmware 6.

It must be noted that this operating mode does not require any additional hardware, i.e, hardware redundancy, since the majority vote can be carried out by software operations.

For what will be called a "high security" option, the specific firmware 6 does not automatically correct the errors itself. The action executed is comprised of a simple detection of an "error detected" state, a state which is transmitted to a human operator (not represented) in the form of a message, for example a visual message (appearing on an operator console, etc.). In this case, it is the operator who decides on the action to be taken in response to the incident detected and who manually performs the error correction operations, i.e. selectively modifies the contents of one or more of the physical nonvolatile memories $NVM_1$ through $NVM_n$.

It is clear that this process is slower than the preceding process, but it offers greater operational security. In fact, in the case where only one memory is declared to be in the "minority" in a configuration comprising a large number of physical nonvolatile memories, it is highly probable, according to the laws of statistics, that it is this memory that is in error. However, this probability decreases considerably when the total number of modules, and hence of nonvolatile memories, is low, or when the proportion of "minority" memories is close to that of the "majority" memories. In other words, in circumstances that are a priori exceptional, the number of memories in error can be greater than the number of memories with correct contents. Under these circumstances, the majority vote leads to an erroneous correction of the contents of the first areas $G_1$ through $G_n$ of all the physical nonvolatile memories $NVM_1$ through $NVM_n$. The result of this is that all or part of the global vital data is lost. Therefore, the "global virtual nonvolatile memory"MVG, i.e., the global vital data, (window FG), seen from the operating system 3, is also in error.

If one or more memories in error cannot be reinitialized, this means that this memory (or these memories) is (or are) defective. The module (or modules) is (or are) shut down, and the window (or windows) is (or are) inaccessible in the virtual address space Av of the local virtual memory MVL.

When the operating system 3 has started up, i.e., during the normal operational state of the machine 1, then the second phase of the procedure for ensuring the integrity of the vital data takes place according to the process of the invention.

For this purpose, a second piece of specific software is used. This involves an intermediate software layer which will be called an "abstraction layer," which expands the functions of the operating system 3 and ensures the necessary interfaces with the latter. It is this layer, which constitutes an extension of the "kernel," that is in charge of providing access to the virtually addressed memory (FIG. 2). It also ensures consistency among the physical nonvolatile memories $NMV_1$ through $NMV_n$.

These arrangements make it possible not to modify the standard operating system of the machine 1, while ensuring the proper functioning of the physical nonvolatile memories $NMV_1$ through $NMV_n$, and the virtual addressing of these memories according to the process of the invention.

The specific software 7 also ensures the supervision of the physical nonvolatile memories $NVM_1$ through $NVM_n$ and the integrity of the data stored in these memories.

To define the concepts, if the operating system 3 is a UNIX (registered trademark) or similar environment, the above-mentioned operations can be carried out under the control of "demons" that run continuously.

When an error is detected, depending on its seriousness, two types of measures can be taken. If it is a fatal error, the module or modules having caused the error is (or are) shut down, or in certain very serious cases even the entire machine. If one or more modules are shut down, according to the invention, their address windows cease to be visible.

The operating system 3 is interfaced with the specific firmware 6 which provides it with a data structure that contains, among other things:

the indication of the maximum number of modules (FIG. 1: $M_1$ through $M_n$), i.e., the maximum configuration of the machine 1);

the description of the partitioning of the address space of the virtual memory Av;

and enough information to access the specific software layer 7 or so-called "abstraction" layer, which makes it possible to read and write the virtually addressed memory Av.

By reading the above, it is easy to see that the invention clearly achieves its stated objects.

It must be clear, however, that the invention is not limited to just the exemplary embodiments explicitly described, particularly in relation to FIGS. 1 through 3.

While the preferred forms and embodiments of the invention have been illustrated and described, it will be apparent to those of ordinary skill in the art that various changes and modifications may be made without deviating from the inventive concept and spirit of the invention as set forth above, and it is intended by the appended claims to define all such concepts which come within the full scope and true spirit of the invention.

What is claimed is:

1. An architecture for management of vital data in a multi-module digital data processing machine, said machine comprising:

predetermined maximum number of modules ($M_1$–$M_n$), each of said modules ($M_1$–$M_n$) including a physical nonvolatile memory ($NVM_1$–$NVM_n$) in which said vital data are stored, each of said physical nonvolatile memories ($NVM_1$–$NVM_n$) including:
  first memory location areas ($G_1$–$G_n$), and
  second memory location areas ($L_1$–$L_n$),
  wherein said first memory areas ($G_1$–$G_n$) are adapted to store global vital data associated with operation of the machine, said global vital data being replicated from one physical nonvolatile memory to another and identical when all the modules are in a correct operational state, and
  wherein said second areas ($L_1$–$L_n$) are adapted to store vital local data associated with operation of respective modules ($M_1$–$M_n$) in which said local physical nonvolatile memory is disposed.

2. The architecture according to claim 1, wherein said physical nonvolatile memories ($NVM_1$–$NVM_n$) are random access memories connected to a continuous electric power source.

3. The architecture according to claim 2, further comprising:

means (4) for addressing a continuous virtual address space (AV) constituted by a first virtually addressed nonvolatile memory (MYG) which renders said global vital data accessible in the form of a single virtual address space (FG), and a second virtually addressed nonvolatile memory (MVL) which renders said local vital data accessible in the form of a series of contiguous virtual address windows ($FL_1$–$FL_n$), the number of windows being equal to said predetermined maximum number of modules, a window associated with a given module ($M_1$–$M_n$) being inaccessible when the given module is defective or non-existent in said data processing machine (1).

4. The architecture according to claim 2, wherein each of said physical nonvolatile memories ($NVM_1$–$NVM_n$) comprises first ($G_1$–$G_n$) and second ($L_1$–$L_n$) memory location areas, said first areas ($G_1$–$G_n$) being adapted to store global vital data associated with the operation of the machine (1), said global vital data being replicated from one physical nonvolatile memory to another and identical when all the modules are in a correct operational state, and said second areas ($L_1$–$L_n$) being adapted to store vital local, so called "private", data associated with the operation of the particular module ($M_1$–$M_n$) in which said local physical nonvolatile memory ($NVM_1$–$NVM_n$) is disposed.

5. The architecture according to claim 4, comprising means (4) for addressing a continuous virtual address space (Av) constituted by a first virtually addressed nonvolatile memory (MVG) which renders said global vital data accessible in the form of a single virtual address space (FG), and a second virtually addressed nonvolatile memory (MVL) which renders said local vital data accessible in the form of a series of contiguous virtual address windows ($FL_1$–$FL_n$), the number of windows being equal to said predetermined maximum number of modules ($M_n$–$M_n$), a window ($FL_1$–$FL_n$) associated with a given module ($M_1$–$M_n$) being inaccessible when the given module is defective or non-existent in said data processing machine (1).

6. A process for management of vital data in a multimodule digital data processing machine having a plurality of modules ($M_1$–$M_n$), each said module having disposed therein a physical nonvolatile memory ($NVM_1$–$NVM_n$) for storing vital data, said process comprising:

loading said physical nonvolatile memories ($NVM_1$–$NVM_n$) with identical global vital data, wherein each of said physical nonvolatile memories comprises first and second memory location areas, said first areas being adapted to store global vital data associated with operation of the machine, said global vital data being replicated from one physical nonvolatile memory to another and identical when all the modules are in a correct operational state, and said second areas being adapted to store vital local data associated with operation of the particular module in which said local physical nonvolatile memory is disposed.

7. The process according to claim 6, further comprising a step for forming a continuous virtual address space (Av), constituted by a first virtually addressed nonvolatile memory (MVG) which renders said global vital data accessible in the form of a single virtual address space (FG), and a second virtually addressed nonvolatile memory (MVL) which renders said local vital data accessible in the form of a series of contiguous virtual address windows ($FL_1$–$FL_n$), and detecting defective or non-existent modules ($M_1$–$M_n$) in said machine (1), which renders the virtual address windows ($FL_1$–$FL_n$) associated with they physical nonvolatile memories ($NVM_1$–$NVM_n$) of said modules ($M_1$–$M_n$) inaccessible in the virtual address space of the local virtual nonvolatile memory (MVL).

8. The process according to claim 7, comprising verifying the proper functioning of said physical nonvolatile memories ($NVM_1$–$NVM_n$) in order to detect said defective modules ($M_1$–$M_n$) in an initial phase during the start up of said machine.

9. The process according to claim 8, further comprising comparing the contents of said first address areas ($G_1$–$G_n$) of all the physical nonvolatile memories ($NVM_1$–$NVM_n$) existing in said machine (1) during the initial phase and generating an error condition upon detection of at least one disparity.

10. The process according to claim 9, further comprisng, upon detection of an error, carrying out a majority vote among the contents of said first areas ($G_1$–$G_n$) of all the physical nonvolatile memories ($NVM_1$–$NVM_n$), and reinitializing the contents of the first address areas of the minority memories as a result of said vote by loading the first address areas with the contents of the first address areas of the majority memories to eliminate said error condition.

11. The process according to claim 10, comprising transmitting a message to an operator of said machine to indicate said error condition, and manually correcting said detected error.

12. The process according to claim 11, characterized in that said initial phase takes place under the control of a specific firmware (6).

13. The process according to claim 12, wherein said specific firmware (6) is interfaced with an operating system (3) of said machine (1) and said specific firmware comprises a list of data accessible by said operating system (3) which contains, at least, information on said predetermined maximum number of modules ($M_1$–$M_n$), information on the partitioning of said virtual address space of said virtual nonvolatile memory (Av) and information which enables the operating system (3) to access said specific software (7) so as to allow read and write operations in said virtual nonvolatile memory (Av).

14. The process according to claim 10, characterized in that said initial phase takes place under the control of a specific firmware (6).

15. The process according to claim 14, wherein said specific firmware (6) is interfaced with an operating system (3) of said machine (1) and said specific firmware comprises a list of data accessible by said operating system (3) which contains, at least, information on said predetermined maximum number of modules ($M_1$–$M_n$), information on the partitioning of said virtual address space of said virtual nonvolatile memory (Av) and information which enables the operating system (3) to access said specific software (7) so as to allow read and write operations in said virtual nonvolatile memory (Av).

16. The process according to claim 9, characterized in that said initial phase takes place under the control of a specific firmware (6).

17. The process according to claim 16, wherein said specific firmware (6) is interfaced with an operating system (3) of said machine (1) and said specific firmware comprises a list of data accessible by said operating system (3) which contains, at least, information on said predetermined maximum number of modules ($M_1$–$M_n$), information on the partitioning of said virtual address space of said virtual nonvolatile memory (Av) and information which enables the operating system (3) to access said specific software (7) so as to allow read and write operations in said virtual nonvolatile memory (Av).

18. The process according to claim 7, comprising the step of scanning the states of said physical nonvolatile memories ($NVM_1$–$NVM_n$) and detecting the appearance of malfunctions in the operation of said modules ($M_1$–$M_n$) when the operating system (3) with which said machine (1) is equipped is started up.

19. The process according to claim 18, wherein the step of scanning takes place under the control of a specific software (7) forming an extension of said operating system (3), and said specific software (7) ensures access to said virtual nonvolatile memory (Av) and consistency of the contents of said first areas ($G_1$–$G_n$) of all the physical nonvolatile memories ($NVM_1$–$NVM_n$).

20. The process according to claim 19, wherein said specific firmware (6) is interfaced with an operating system (3) of said machine (1) and said specific firmware comprises a list of data accessible by said operating system (3) which contains, at least, information on said predetermined maximum number of modules ($M_1$–$M_n$), information on the partitioning of said virtual address space of said virtual nonvolatile memory (Av) and information which enables the operating system (3) to access said specific software (7) so as to allow read and write operations in said virtual nonvolatile memory (Av).

* * * * *

UNITED STATES PATENT AND TRADEMARK OFFICE
CERTIFICATE OF CORRECTION

PATENT NO. : 6,434,679 B1
DATED : August 13, 2002
INVENTOR(S) : de Bonis-Hamelin et al.

It is certified that error appears in the above-identified patent and that said Letters Patent is hereby corrected as shown below:

Column 6,
Line 27, before "predetermined" insert -- a --;
Line 53, substitute "(MYG)" with -- (MVG) --;

Signed and Sealed this

Fifteenth Day of October, 2002

Attest:

Attesting Officer

JAMES E. ROGAN
Director of the United States Patent and Trademark Office